(12) United States Patent
Cheng et al.

(10) Patent No.: US 10,439,008 B2
(45) Date of Patent: Oct. 8, 2019

(54) ORGANIC LIGHT-EMITTING DISPLAY PANEL AND MANUFACTURING METHOD THEREOF, AND ORGANIC LIGHT-EMITTING DISPLAY DEVICE

(71) Applicant: SHANGHAI TIANMA AM-OLED CO., LTD., Shanghai (CN)

(72) Inventors: Shuang Cheng, Shanghai (CN); Xiangcheng Wang, Shanghai (CN); Jinghua Niu, Shanghai (CN); Hamada Yuji, Shanghai (CN); Jianyun Wang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 66 days.

(21) Appl. No.: 15/787,715

(22) Filed: Oct. 19, 2017

(65) Prior Publication Data
US 2018/0061896 A1 Mar. 1, 2018

(30) Foreign Application Priority Data
Jun. 12, 2017 (CN) .......................... 2017 1 0438656

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3206* (2013.01); *H01L 27/3246* (2013.01);
(Continued)

(58) Field of Classification Search
CPC ............... H01L 27/322; H01L 27/3206; H01L 51/5265; H01L 27/3246; H01L 51/5262;
(Continued)

(56) References Cited

U.S. PATENT DOCUMENTS

| 6,066,357 A * | 5/2000 | Tang | H01L 27/3211 427/164 |
| 2009/0200922 A1* | 8/2009 | Lee | H01L 51/5265 313/504 |

(Continued)

FOREIGN PATENT DOCUMENTS

| CN | 101222023 A | 7/2008 |
| CN | 106784363 A | 5/2017 |

*Primary Examiner* — Wael M Fahmy
*Assistant Examiner* — Sue Tang
(74) *Attorney, Agent, or Firm* — Kilpatrick Townsend & Stockton LLP

(57) ABSTRACT

The present application discloses an organic light-emitting display panel and a manufacturing method thereof, and an organic light-emitting display device. The organic light-emitting display panel comprises a substrate, a first electrode layer, a second electrode layer, an organic light-emitting functional layer formed between the first electrode layer and the second electrode layer and comprising a plurality of first optical adjustment units, a plurality of second optical adjustment units and at least one light emitting layer covering a display area of the organic light-emitting display panel, and a pixel definition layer partitioning the organic light-emitting functional layer to form a pixel array comprising a first color pixel, a second color pixel and a third color pixel in an array arrangement.

21 Claims, 9 Drawing Sheets

(52) U.S. Cl.
CPC ...... *H01L 51/5218* (2013.01); *H01L 51/5221* (2013.01); *H01L 51/5262* (2013.01); *H01L 51/5265* (2013.01); *H01L 51/56* (2013.01)

(58) Field of Classification Search
CPC .. H01L 51/5221; H01L 51/5218; H01L 51/56
See application file for complete search history.

(56) References Cited

U.S. PATENT DOCUMENTS

2015/0090972 A1* 4/2015 Lee .................... H01L 27/3211
257/40
2017/0133437 A1* 5/2017 Komatsu ............ H01L 27/3206

* cited by examiner

ORGANIC LIGHT-EMITTING DISPLAY PANEL AND MANUFACTURING METHOD THEREOF, AND ORGANIC LIGHT-EMITTING DISPLAY DEVICE

CROSS-REFERENCE TO RELATED APPLICATION

This application is related to and claims priority from Chinese Patent Application No. 201710438656.5, filed on Jun. 12, 2017, entitled "Organic Light-Emitting Display Panel and Manufacturing Method thereof, and Organic Light-Emitting Display Device," the entire disclosure of which is hereby incorporated by reference for all purposes.

TECHNICAL FIELD

The present disclosure relates to the technical field of display, and specifically relates to an organic light-emitting display panel and a manufacturing method thereof, and an organic light-emitting display device.

BACKGROUND

An OLED (Organic Light-Emitting Diode) display is used more and more widely in all kinds of portable electronic devices because of its lightweight, power saving and other characteristics.

An OLED refers to a diode emitting light through current carrier injection and recombination by use of an organic light-emitting material driven by an electric field. A transparent electrode and a metal electrode are used as one of an anode and a cathode of a device respectively, and under the driving of a certain voltage, electrons and holes are injected into electron and hole transport layers through an electron injection layer and a hole injection layer respectively from the cathode and the anode, then are migrated to a light emitting layer through the electron and hole transport layers respectively, and meet each other in the light emitting layer to form excitons and excite photons which emit visible light through radiative relaxation.

Because of transmission and reflection characteristics of an anode layer and a cathode layer, the light emitted by the organic light-emitting layer is reflected back and forth between the anode layer and the cathode layer to form a microcavity effect. The microcavity effect can enhance a resonant wavelength and improve the color purity and light-emitting efficiency of an OLED device.

However, due to different intrinsic emission wavelengths of different color lights, the microcavity lengths required by different color lights are different. When manufacturing an organic light-emitting display panel (hereinafter referred to as an OLED display panel), it is usually necessary to adjust the cavity length of a microcavity according to the color of the light emitted by each pixel. For example, when manufacturing an R (red) G (green) B (blue) three-color OLED display panel, three fine masks for three colors, i.e., R, G and B, respectively, are needed to form optical compensation layers of R, G, and B pixels on a hole transport layer. Then, three fine masks for the three colors, R, G and B, respectively, are used to form organic light emitting layers on the corresponding optical compensation layers. Thus, the number of the fine masks required for manufacturing the OLED display panel is larger, resulting in that the process for manufacturing the OLED display panel is complex and the yield is reduced.

SUMMARY

In view of the above defects or shortcomings in the prior art, an organic light-emitting display panel and a manufacturing method thereof, and an organic light-emitting display device are expected to be provided, so as to solve the technical problems in the prior art.

In one aspect, an embodiment of the present application provides an organic light-emitting display panel, including a substrate, a first electrode layer including first electrodes in an array arrangement, a second electrode layer including at least one second electrode, an organic light-emitting functional layer formed between the first electrode layer and the second electrode layer, and a pixel definition layer partitioning the organic light-emitting functional layer to form a pixel array including a first color pixel, a second color pixel and a third color pixel in an array arrangement, wherein the organic light-emitting functional layer includes a plurality of first optical adjustment units, a plurality of second optical adjustment units and at least one light emitting layer covering a display area of the organic light-emitting display panel; and each first optical adjustment unit is formed in a pixel area of each first color pixel, each second optical adjustment unit is formed in a pixel area of each second color pixel, and the thickness of the first optical adjustment unit is different from that of the second optical adjustment unit.

In another aspect, the embodiment of the present application provides a manufacturing method of the organic light-emitting display panel, including: forming a first electrode layer on a first side of a substrate, the first electrode layer including first electrodes in an array arrangement; forming an organic light-emitting functional layer on the first side of the substrate; forming a pixel definition layer on the first side of the substrate, the pixel definition layer partitioning the organic light-emitting functional layer to form a pixel array including a first color pixel, a second color pixel and a third color pixel in an array arrangement; and forming a second electrode layer including at least one second electrode, wherein the organic light-emitting functional layer includes a plurality of first optical adjustment units, a plurality of second optical adjustment units and at least one light emitting layer covering a display area of the organic light-emitting display panel; and each first optical adjustment unit is formed in a pixel area of each first color pixel, each second optical adjustment unit is formed in a pixel area of each second color pixel, and the thickness of the first optical adjustment unit is different from that of the second optical adjustment unit.

In another aspect, the embodiment of the present application further provides an organic light-emitting display device including the organic light-emitting display panel described above.

According to the scheme of the present application, by setting the light emitting layer covering the display area and setting the first optical adjustment unit in the pixel area of each first color pixel and the second optical adjustment unit in the pixel area of each second color pixel respectively, the microcavity lengths of different pixel areas are adjusted, and then subpixels with various colors emit different color lights. Thus, the first optical adjustment unit and the second optical adjustment unit are manufactured respectively by only using fine masks, and the number of fine masks required for manufacturing an OLED display panel is reduced, thereby reducing the difficulty of manufacturing the OLED display panel, and improving the manufacturing yield and manufacturing efficiency.

BRIEF DESCRIPTION OF THE DRAWINGS

Other features, objectives and advantages of the present application will become more apparent by reading a detailed description of the nonrestrictive embodiments made with reference to the following drawings.

DETAILED DESCRIPTION OF EMBODIMENTS

The present application will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 1:
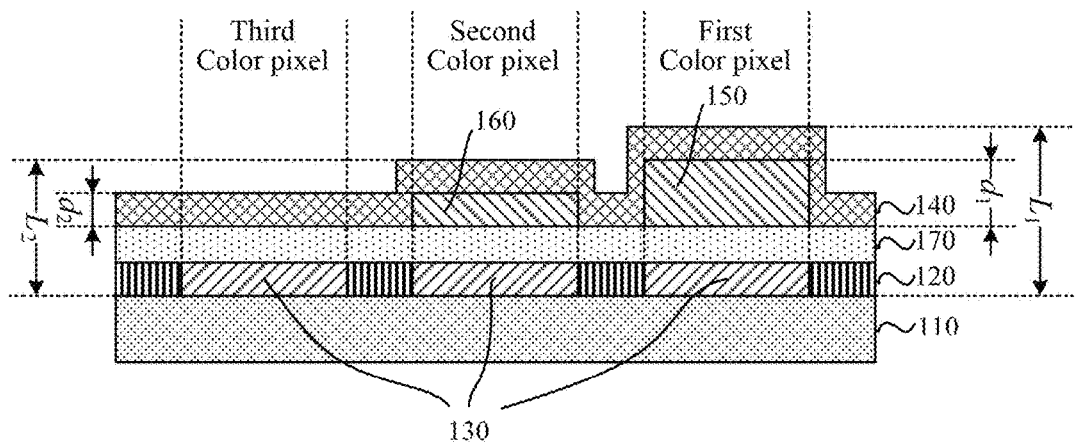
FIG. 1 shows a schematic structure diagram of one embodiment of the OLED display panel of the present application.

Refer to FIG. 1, it shows a schematic structure diagram of one embodiment of the OLED display panel of the present application.

The OLED display panel of the present embodiment includes a substrate 110, a first electrode layer, a second electrode layer, an organic light-emitting functional layer and a pixel definition layer 120.

The first electrode layer includes first electrodes in an array arrangement. The second electrode layer includes at least one second electrode 140. Here, one of the first electrode 130 and the second electrode 140 may be an anode, and the other one is a cathode. For example, in some application scenarios, the first electrode 130 may be an anode, and the second electrode 140 may be a cathode. In these application scenarios, each anode may supply a data voltage to each pixel, while the cathode may be connected to a fixed potential (for example, connected to a supply voltage PVEE). Thus, an OLED is conducted to emit light under the action of a voltage difference between the anode and the cathode.

The organic light-emitting functional layer is formed between the first electrode layer and the second electrode layer. The pixel definition layer 120 partitions the organic light-emitting functional layer to form a pixel array. FIG. 1 schematically shows that the pixel array includes a first color pixel, a second color pixel and a third color pixel in an array arrangement. The pixel definition layer 120 generally is made of an insulating material and as a result, when a data voltage is applied to the anode of a pixel to form an electric field between the anode and the cathode, and electrons and holes can migrate in the pixel area and cannot wrongly migrate to a pixel adjacent to the pixel area due to an insulation effect of the pixel definition layer.

The organic light-emitting functional layer includes a plurality of first optical adjustment units 150, a plurality of second optical adjustment units 160 and at least one light emitting layer 170. The light emitting layer 170 covers the display area of the organic light-emitting display panel. Each first optical adjustment unit 150 is formed in a pixel area of each first color pixel, each second optical adjustment unit 160 is formed in a pixel area of each second color pixel, and the thickness of the first optical adjustment unit 150 is different from that of the second optical adjustment unit 160.

In the present embodiment, because the light emitting layer 170 covers the display area of the OLED display panel, the light emitting layer 170 in each pixel area has an identical material and a uniform thickness, and if not adjusted, the intrinsic light-emitting wavelength of each pixel will be consistent. In order to enable the OLED display panel to display a color picture, the microcavity effect may be used to "screen" a desired color light.

Specifically, the OLED display panel of the present embodiment is supposed to include a composite light-emitting layer (e.g., a white light emitting layer). A long microcavity length may enhance a color light with a long wavelength in compound lights to inhibit emergence of other color lights, and a short microcavity length can enhance a color light with a short wavelength in the compound lights to inhibit emergency other color lights. In the present embodiment, by setting different thicknesses for the first optical adjustment unit 150 and the second optical adjustment unit 160, the microcavity length of the first color pixel is different from that of the second color pixel, and then the first color pixel and the second color pixel may emit a first color light and a second color light with different wavelengths respectively.

According to the OLED display panel of the present embodiment, because the organic light-emitting functional layer has a light emitting layer covering the whole display area, the microcavity lengths of the first color pixel and the second color pixel are adjusted respectively through the first optical adjustment unit 150 and the second optical adjustment unit 160, and in a manufacturing process, only two fine masks (i.e., a fine mask for manufacturing the first optical adjustment unit 150 and a fine mask for manufacturing the second optical adjustment unit 160) are required, and the number of the fine masks required to manufacture the OLED display panel is reduced, thereby reducing the difficulty of manufacturing the OLED display panel, and improving the manufacturing yield and manufacturing efficiency of the OLED display panel.

In some optional implementations of the present embodiment, as shown in FIG. 1, the thickness $d_1$ of the first optical adjustment unit 150 may be greater than the thickness $d_2$ of the second optical adjustment unit 160, thus, the microcavity length $L_1$ of the first color pixel correspondingly is greater than the microcavity length $L_2$ of the second color pixel, thereby enabling the wavelength of a first color light emitted by the first color pixel to be greater than the wavelength of a second color light emitted by the second color pixel.

It should be noted that although no optical adjustment unit is arranged in the pixel area of the third color pixel, as shown in FIG. 1, it is only schematic. On the basis of obtaining the technical scheme disclosed by the present embodiment, those skilled in the art may determine whether to set an optical adjustment unit for the third color pixel or not according to requirements of specific application scenarios. For example, whether to set an optical adjustment unit for the third color pixel or not may be determined according to a correspondence between the microcavity length of the third color pixel and the wavelength of a third color light emitted by the third color pixel. Therefore, regardless of any optical adjustment unit arranged in the third color pixel, as long as structural members provided by the present embodiment is included, it is deemed to fall within the scope of protection of the present embodiment. On the other hand, regardless of any optical adjustment unit arranged in the third color pixel, the wavelengths of emergent lights of the light emitting layer may be screened through a microcavity effect to ensure that the colors of the lights emitted by the first color pixel, the second color pixel and the third color pixel are different, thereby enabling the OLED display panel to achieve full-color display.

Figure 2:
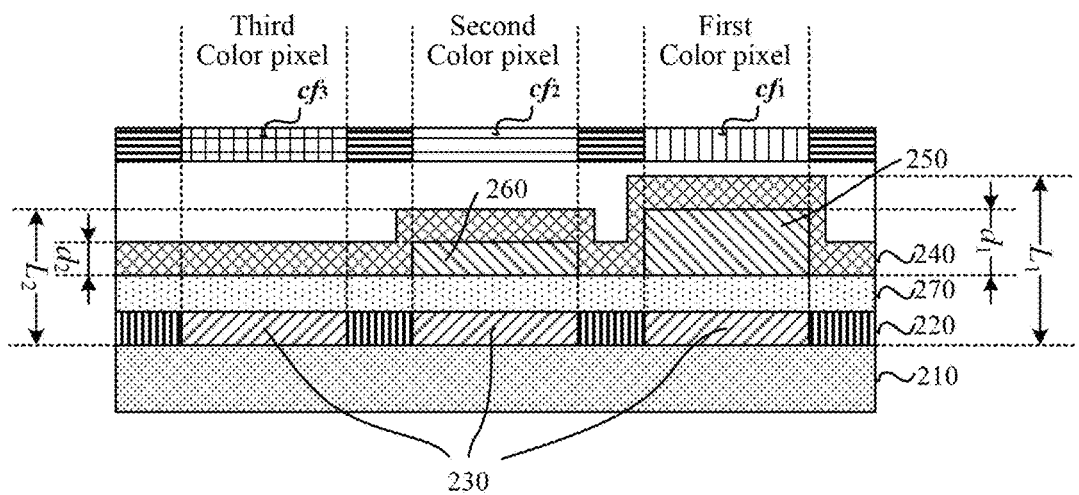
FIG. 2 shows a schematic structure diagram of another embodiment of the OLED display panel of the present application.

Refer to FIG. 2, it shows a schematic structure diagram of another embodiment of the OLED display panel of the present application.

Similar to the embodiment shown in FIG. 1, the OLED display panel of the present embodiment also includes a substrate 210, a first electrode layer, a second electrode layer, an organic light-emitting functional layer and a pixel definition layer 220. The first electrode layer includes first electrodes 230 in an array arrangement. The second electrode layer includes at least one second electrode 240. The organic light-emitting functional layer is formed between the first electrode layer and the second electrode layer. The pixel definition layer 220 partitions the organic light-emitting functional layer to form a pixel array. The organic light-emitting functional layer includes a plurality of first optical adjustment units 250, a plurality of second optical adjustment units 260 and at least one light emitting layer 270. Moreover, the above structural members have a similar structure with the embodiment shown in FIG. 1.

Unlike the embodiment shown in FIG. 1, the present embodiment further includes a color filter layer.

As shown in FIG. 2, the color filter layer includes a first-color color filter unit $cf_1$, a second-color color filter unit $cf_2$ and a third-color color filter unit $cf_3$ in an array arrangement. An orthographic projection of each first-color color filter unit $cf_1$ to the organic light-emitting functional layer is formed in a pixel area of each first color pixel, an orthographic projection of each second-color color filter unit $cf_2$ to the organic light-emitting functional layer is formed in a pixel area of each second color pixel, and an orthographic projection of each third-color color filter unit $cf_3$ to the organic light-emitting functional layer is formed in a pixel area of each third color pixel.

Similar to the embodiment shown in FIG. 1, the OLED display panel of the present embodiment also adjusts the microcavity lengths of the first color pixel and the second color pixel respectively through the first optical adjustment unit 250 arranged in the first color pixel and the second optical adjustment unit 260 arranged in the second color pixel, thereby enhancing emergence of lights with different wavelengths respectively. The number of fine masks required for manufacturing the OLED display panel may be reduced, thereby reducing the difficulty of manufacturing the OLED display panel, and improving the manufacturing yield and manufacturing efficiency of the OLED display panel.

In addition, since the color filter layer is added in the present embodiment, a light component not expected to be emitted in subpixels with various colors can be further filtered to ensure that the range of the wavelengths of the lights respectively emitted by the first color pixel, the second color pixel and the third color pixel is smaller, thereby further enlarging the color gamut of the OLED display panel.

Figure 3:
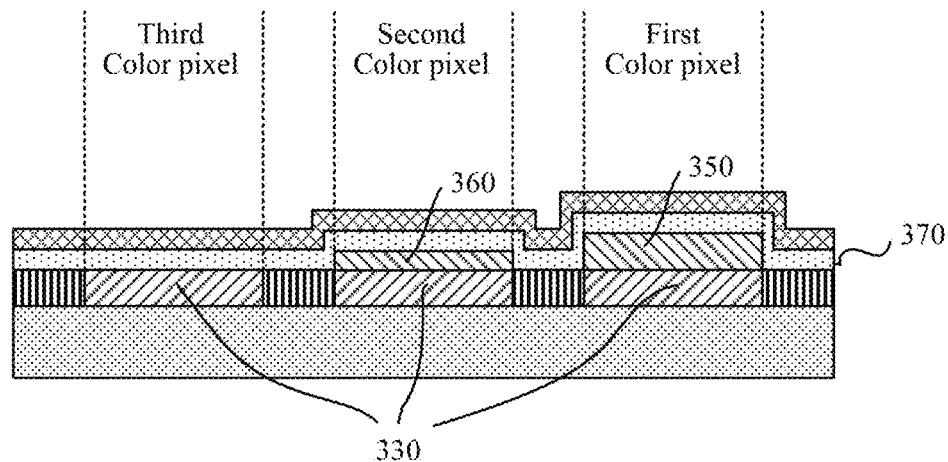
FIG. 3 shows a schematic structure diagram of an optional implementation of the OLED display panel of the present application.

In some optional implementations of the OLED display panel (for example, the OLED display panel of the embodiment shown in FIG. 1 or the OLED display panel of the embodiment shown in FIG. 2) of the present application, the first optical adjustment unit and the second optical adjustment unit are formed between the light emitting layer and the second electrode layer, for example, in the embodiment shown in FIG. 1, the first optical adjustment unit 150 and the second optical adjustment unit 160 are formed between the light emitting layer 170 and the second electrode layer formed with a second electrode 140; and in the embodiment shown in FIG. 2, the first optical adjustment unit 250 and the second optical adjustment unit 260 are also formed between the light emitting layer 270 and a second electrode layer formed with a second electrode 240. Or, in some other optional implementations of the OLED display panel of the present application, as shown in FIG. 3, the first optical adjustment unit 350 and the second optical adjustment unit 360 may be formed between the light emitting layer 370 and the first electrode layer formed with a first electrode 330. Or, in some other optional implementations of the OLED display panel of the present application, one of the first optical adjustment unit and the second optical adjustment unit may be formed between the first electrode layer and the light emitting layer, while the other one of the first optical adjustment unit and the second optical adjustment unit may be formed between the second electrode layer and the light emitting layer.

Figure 4:
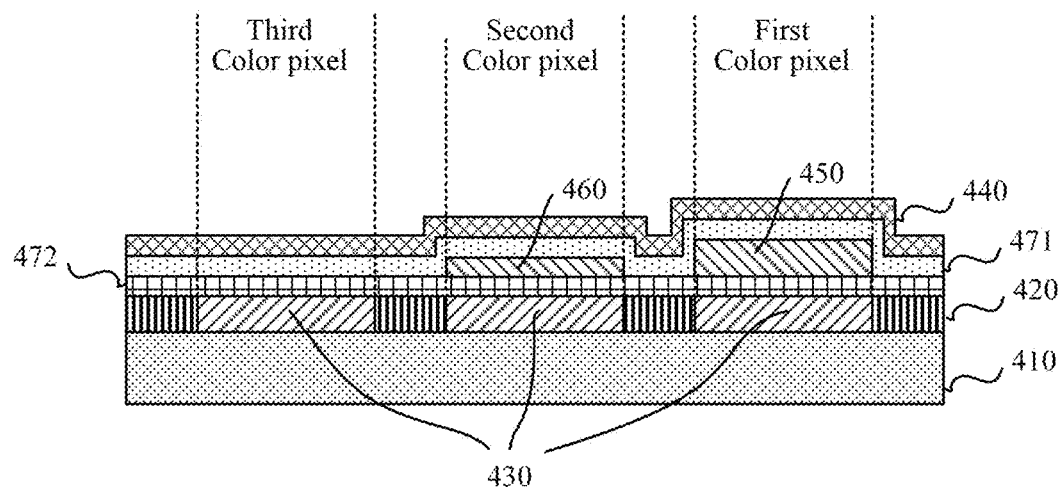
FIG. 4 shows a schematic structure diagram of another embodiment of the OLED display panel of the present application.

Refer to FIG. 4, it shows a schematic structure diagram of another embodiment of the OLED display panel of the present application.

Similar to the embodiment shown in FIG. 1, the OLED display panel of the present embodiment also includes a substrate 410, a first electrode layer, a second electrode layer, an organic light-emitting functional layer and a pixel definition layer 420.

The first electrode layer includes first electrodes 430 in an array arrangement. The second electrode layer includes at least one second electrode 440. The organic light-emitting functional layer is formed between the first electrode layer and the second electrode layer. The pixel definition layer 420 partitions the organic light-emitting functional layer to form a pixel array. The organic light-emitting functional layer includes a plurality of first optical adjustment units 450 and a plurality of second optical adjustment units 460. Moreover, the above structural members have a similar structure with the embodiment shown in FIG. 1.

Unlike the embodiment shown in FIG. 1, the present embodiment further defines that the organic light-emitting functional layer includes two light emitting layers 471 and 472. Moreover, the first optical adjustment unit 450 and the second optical adjustment unit 460 are formed between the two light emitting layers 471 and 472.

Similar to the embodiment shown in FIG. 1, the OLED display panel of the present embodiment also adjusts the microcavity lengths of the first color pixel and the second color pixel respectively through the first optical adjustment unit 450 arranged in the first color pixel and the second optical adjustment unit 460 arranged in the second color pixel, thereby enhancing emergence of lights with different wavelengths respectively. The number of fine masks required for manufacturing the OLED display panel may be reduced, thereby reducing the difficulty of manufacturing the OLED display panel, and improving the manufacturing yield and manufacturing efficiency of the OLED display panel.

In addition, the OLED display panel of the present embodiment includes two light emitting layers 471 and 472, thus, a compound light may be formed by recombining single-color lights emitted by two single-color light emitting layers (for example, a yellow light emitting layer and a blue light emitting layer), and the microcavity effect of different cavity lengths is further used to screen the wavelength of the light expected to be emitted from each pixel. By forming a compound light through recombination of single-color lights emitted by two or more single-color light emitting layers, the optional range of light-emitting materials for manufacturing the light emitting layer may be broadened, thereby further reducing the difficulty of manufacturing the OLED display panel. On the other hand, the light-emitting material of the compound light usually needs mixing of light-emitting materials of a plurality of single-color lights for recombining the compound light, and then the mixed material is formed onto the substrate by, for example, an evaporation process. Thus, the uniformity of the color of the emergent lights of a finally formed compound light emitting layer will depend on the degree of uniformity of mixing. On the contrary, during manufacturing the single-color light emitting layer, the problem of the degree of uniformity of mixing is not considered because the light-emitting material for manufacturing the single-color light emitting layer is single. Thus, when the two light emitting layers 471 and 472 included in the OLED display panel of the present embodiment are single-color light emitting layers, the manufacturing process is less difficult, and the yield of the manufactured OLED display panel is correspondingly higher.

Figure 5:
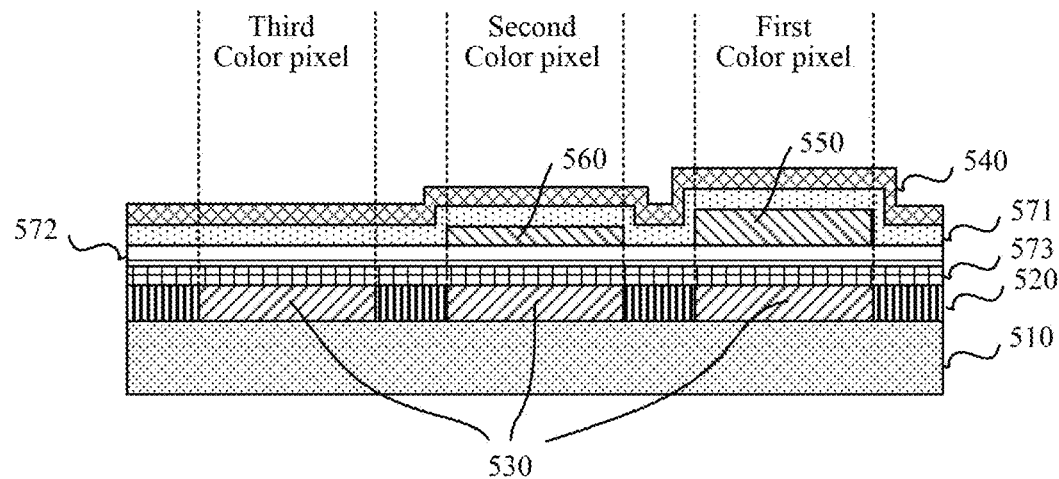
FIG. 5 shows a schematic structure diagram of an optional implementation of the OLED display panel of the embodiment shown in FIG. 4.

In some optional implementations of the present embodiment, as shown in FIG. 5, the organic light-emitting functional layer includes a red light emitting layer 571, a green light emitting layer 572 and a blue light emitting layer 573. Similar to the embodiment shown in FIG. 1, the OLED display panel of the present embodiment also includes a substrate 510, a first electrode layer, a second electrode layer, an organic light-emitting functional layer and a pixel definition layer 520. The first electrode layer includes first electrodes 530 in an array arrangement. The second electrode layer includes at least one second electrode 540.

In these optional implementations, the first optical adjustment unit 550 and the second optical adjustment unit 560 may be formed between any adjacent two of the red light emitting layer 571, the green light emitting layer 572 and the blue light emitting layer 573.

It should be noted that, the laminating order of the red light emitting layer 571, the green light emitting layer 572 and the blue light emitting layer 573 shown in FIG. 5 is only schematic. Those skilled in the art can adjust the laminating order of the three light emitting layers according to requirements of specific application scenarios and a manufacturing process.

Moreover, although FIG. 5 shows that the first optical adjustment unit 550 and the second optical adjustment unit 560 are formed between the red light emitting layer 571 and green light emitting layer 572, the relative position relation is only schematic. Those skilled in the art can adjust the relative position relation among the first optical adjustment unit, the second optical adjustment unit and the light emitting layers according to the requirements of specific application scenarios and the manufacturing process, for example, the first optical adjustment unit and the second optical adjustment unit are arranged between the green light emitting layer and the blue light emitting layer, or one of the first optical adjustment unit and the second optical adjustment unit is arranged between the green light emitting layer and the blue light emitting layer while the other one of the first optical adjustment unit and the second optical adjustment unit is arranged between the red light emitting layer and the blue light emitting layer.

Thus, since the laminating relation among the first optical adjustment unit, the second optical adjustment unit, and the three (red, green and blue) light emitting layers may be appropriately adjusted, the difficulty of the manufacturing process of the OLED display panel is reduced and the manufacturing yield of the OLED display panel is improved.

Figure 6:
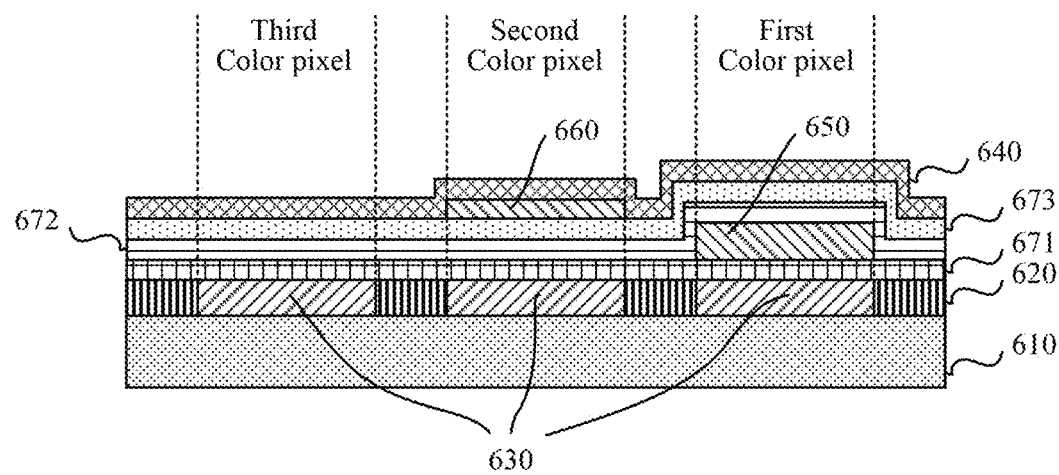
FIG. 6 shows a schematic structure diagram of another embodiment of the OLED display panel of the present application.

Refer to FIG. 6, it shows a schematic structure diagram of another embodiment of the OLED display panel of the present application.

Similar to the embodiment shown in FIG. 1, the OLED display panel of the present embodiment also includes a substrate 610, a first electrode layer, a second electrode layer, an organic light-emitting functional layer and a pixel definition layer 620. The first electrode layer includes first electrodes 630 in an array arrangement. The second electrode layer includes at least one second electrode 640. The organic light-emitting functional layer is formed between the first electrode layer and the second electrode layer. The pixel definition layer 620 partitions the organic light-emitting functional layer to form a pixel array. The organic light-emitting functional layer includes a plurality of first optical adjustment units 650 and a plurality of second optical adjustment units 660. Moreover, the above structural members have a similar structure with the embodiment shown in FIG. 1.

Unlike the embodiment shown in FIG. 1, the present embodiment further defines that the color light emitted by the first color pixel is red light, the color light emitted by the second color pixel is green light, and the color light emitted by the third color pixel is blue light. The organic light-emitting functional layer includes a red light emitting layer 671, a green light emitting layer 672 and a blue light emitting layer 673. The red light emitting layer 671, the blue light emitting layer 672 and the green light emitting layer 673 are laminated in an order from the near to the distant from the first electrode layer. Each first optical adjustment unit 650 is formed between the red light emitting layer 671 and the blue light emitting layer 672. Each second optical adjustment unit 660 is formed on a side of the green light emitting layer 673 away from the substrate 610, for example, as shown in FIG. 6, the second optical adjustment unit 660 is formed on the upper surface of the green light emitting layer 673.

Similar to the above embodiments, since the organic light-emitting functional layer has a light emitting layer covering the whole display area, the OLED display panel of the present embodiment may adjust the microcavity lengths of the first color pixel and the second color pixel respectively through the first optical adjustment unit 650 and the second optical adjustment unit 660. The number of fine masks required for manufacturing the OLED display panel is reduced, thereby reducing the difficulty of manufacturing the OLED display panel, and improving the manufacturing yield and manufacturing efficiency of the OLED display panel.

Hereinafter, a further technical effect of the present embodiment will be described in conjunction with FIG. 7A to FIG. 7C.

Figure 7A:
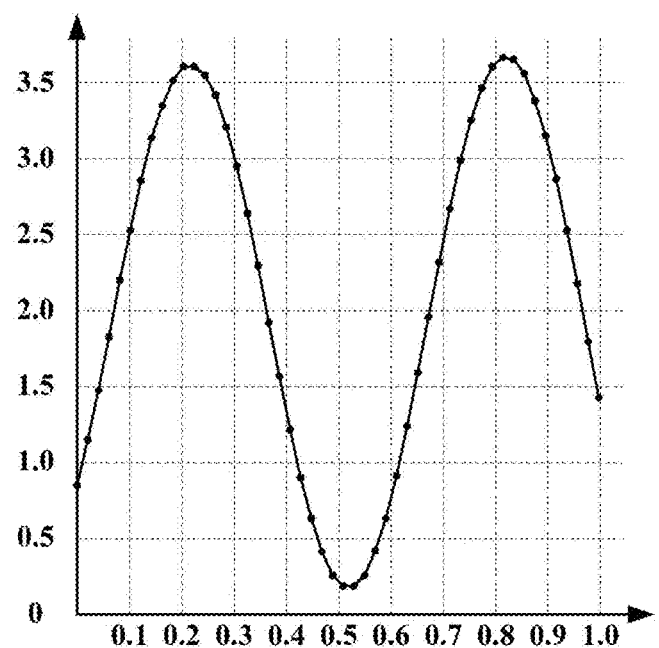
FIG. 7A to FIG. 7C show waveform diagrams of the light intensity changes of the red light emitting layer, the green light emitting layer and the blue light emitting layer at different positions of the microcavity, respectively.
Figure 7B:
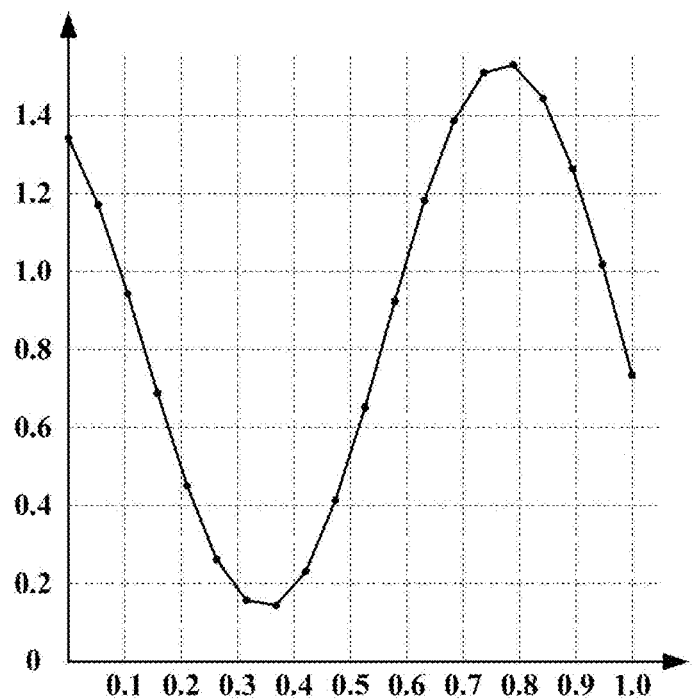
Figure 7C:
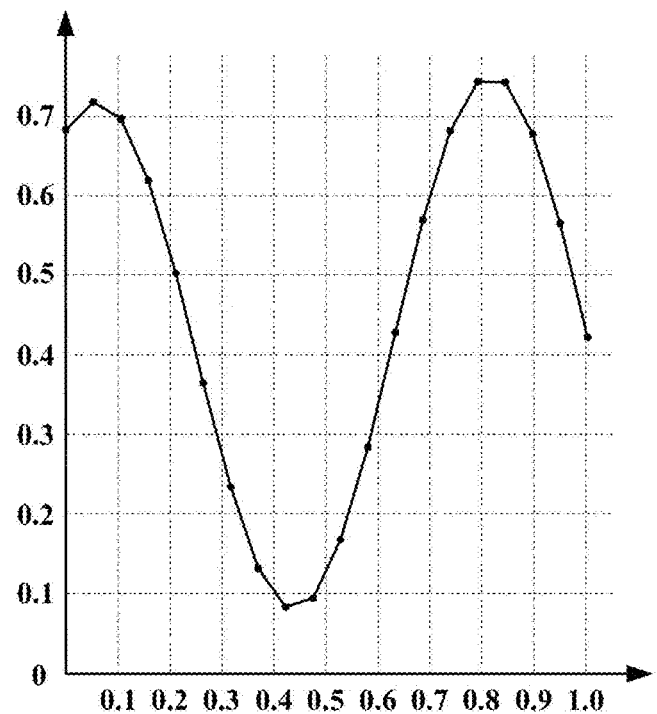

FIG. 7A to FIG. 7C show waveform diagrams of the light intensity changes of the red light emitting layer, the green light emitting layer and the blue light emitting layer at different positions of the microcavity, respectively. The vertical ordinates of FIG. 7A to FIG. 7C represent the light intensity per unit area and have a unit of candela/sq. m. (cd/m$^2$), while the horizontal ordinates of FIG. 7A to FIG. 7C represent relative positions of the red light emitting layer, the green light emitting layer and the blue light emitting layer in the microcavity respectively, i.e., the ratio of the distance between light-emitting centers of the red light emitting layer, the green light emitting layer and the blue light emitting layer and the anode to the microcavity length. For example, the microcavity length is 10 μm, the horizontal ordinate 0.7 represents that the distance between the light-emitting center of the light emitting layer and the anode is 7 μm and the distance between the light-emitting center of the emitting layer and the cathode is 3 μm.

It can be seen from waveforms of FIG. 7A to FIG. 7C that when the light-emitting center of each light emitting layer is close to the center of the microcavity, the light intensity is weak. For example, as shown in FIG. 7A, when the red light emitting layer is between the horizontal ordinates 0.4-0.6, the light intensity is less than 1.0 and is 30% smaller than a light intensity peak value (about 3.7). Similarly, as shown in FIG. 7B, when the green light emitting layer is between the horizontal ordinates 0.2-0.5, the light intensity is less than 0.4 and is 25% smaller than a light intensity peak value (about 1.6). Moreover, as shown in FIG. 7C, when the blue light emitting layer is between the horizontal ordinates 0.35-0.55, the light intensity is less than 0.2 and is 26% smaller than a light intensity peak value (about 0.75).

It can be concluded from the above analysis, in order to make the light intensity of emergent lights emitted by the light emitting layers be close as possible to the light intensity peak value, the light-emitting centers of the light emitting layers should be avoided to be set near the center of the microcavity as much as possible (i.e., near the horizontal ordinate 0.5 of FIG. 7A to FIG. 7C). The light-emitting center of each light emitting layer is shifted to two sides of the microcavity, so that the light intensity of the emergent light of each light emitting layer can be close to a peak value of the light intensity as much as possible.

Continue to refer to the OLED display panel of the present embodiment shown in FIG. 6, in the first color pixel, the position of the red light emitting layer 671 at the microcavity may enable the red light emitted by the red light emitting layer 671 to be closer to the peak value of the light intensity but enable the blue light emitted by the blue light emitting layer 672 and the green light emitted by the green light emitting layer 673 to be farther from the peak value of the light intensity. Similarly, in the second color pixel, the position of the green light emitting layer 673 at the microcavity may enable the green light emitted by the green light emitting layer 673 to be closer to the peak value of the light intensity but enable the blue light emitted by the blue light emitting layer 672 and the red light emitted by the red light emitting layer 671 to be farther from the peak value of the light intensity. However, in the third color pixel, the position of the blue light emitting layer 672 at the microcavity may enable the blue light emitted by the blue light emitting layer 672 to be closer to the peak value of the light intensity but enable the green light emitted by the green light emitting layer 673 and the red light emitted by the red light emitting layer 671 to be farther from the peak value of the light intensity. Thus, the microcavity effect can be used to enhance the light expected to be emitted in each pixel to minimize the light intensity of other color lights as much as possible, thereby further enhancing the chromaticity of the OLED display panel in the present embodiment.

In some optional implementations of the present embodiment, for example, the first electrode 630 may be an anode, while the second electrode 640 may be a cathode. In these optional implementations, it can be seen from FIG. 7B that when the brightness center of the green light emitting layer is close to the cathode (the horizontal ordinate is close to 1), the light intensity of the emergent light of the green light emitting layer is closer to even reaches the peak value of the light intensity. In these optional implementations, the hole mobility of each first optical adjustment unit 650 may be greater than the electron mobility of the each first optical adjustment unit 650, while the hole mobility of each second optical adjustment unit 660 may be smaller than the electron mobility of the each second optical adjustment unit 660. For example, the hole mobility of the first optical adjustment unit 650 may be greater than 1×10$^{-4}$cm$^2$/V·s (square centimeter per volt second), while the electron mobility of the second optical adjustment unit 660 may be greater than 1×10$^{-4}$cm$^2$/V·s (square centimeter per volt second).

In this way, because the first optical adjustment unit 650 is closer to the anode and the second optical adjustment unit 660 is closer to the cathode, the first optical adjustment unit 650 may achieve a better hole transport effect, and the second optical adjustment unit 660 may achieve a better electron transport effect, thereby improving the hole and electron transport efficiency of the OLED display panel to improve the light-emitting efficiency.

Figure 8:
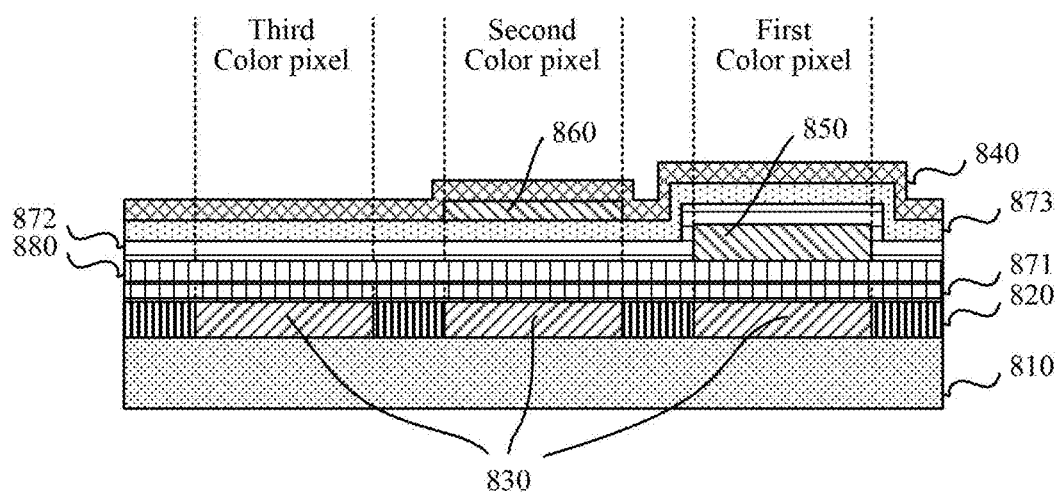
FIG. 8 shows a schematic structure diagram of another embodiment of the OLED display panel of the present application.

Refer to FIG. 8, it shows a schematic structure diagram of the OLED display panel in another embodiment of the present application.

Similar to the embodiment shown in FIG. 6, the OLED display panel of the present embodiment also includes a substrate 810, a first electrode layer, a second electrode layer, an organic light-emitting functional layer and a pixel definition layer 820. The first electrode layer includes first electrodes 830 in an array arrangement. The second electrode layer includes at least one second electrode 840. The organic light-emitting functional layer is formed between the first electrode layer and the second electrode layer. The pixel definition layer 820 partitions the organic light-emitting functional layer to form a pixel array. The organic light-emitting functional layer includes a red light emitting layer 871, a green light emitting layer 873, a blue light emitting layer 872, a plurality of first optical adjustment units 850 and a plurality of second optical adjustment units 860. Moreover, the red light emitting layer 871, the green light emitting layer 873, the blue light emitting layer 872, the first optical adjustment units 850 and the second optical adjustment units 860 also have similar structures and a similar laminating order with the embodiment shown in FIG. 6.

Unlike the embodiment shown in FIG. 6, the OLED display panel of the present embodiment further includes a charge generation layer 880. The charge generation layer 880 is formed between the red light emitting layer 871 and the blue light emitting layer 873, and each first optical adjustment unit 850 is formed between the charge generation layer 880 and the blue light emitting layer 873.

The charge generation layer 880, for example, may be manufactured wholly and covers the display area of the OLED display panel of the present embodiment. The charge generation layer 880 may generate additional holes and electrons, thereby improving the light-emitting efficiency of the OLED display panel of the present embodiment.

In addition, in the present embodiment, the charge generation layer 880 is arranged between the red light emitting layer 871 and the blue light emitting layer 873, so that the pixels (including the first color pixel, the second color pixel and the third color pixel) may utilize the microcavity effect to enhance the color lights expected to be emitted to minimize the light intensity of other color lights as much as possible, thereby further improving the chromaticity of the OLED display panel of the present embodiment.

It should be understood by those skilled in the art that the OLED display panel of each embodiment of the present application further includes some known structures, for example, a hole injection layer, a hole transport layer, an electron injection layer, an electron transport layer, and a thin-film transistor for providing voltage signals to the first electrodes and/or the second electrodes of the OLED display panel. In order not to obscure the focus of the present application, these known structures will no longer be further described.

In addition, in the OLED display panel of each embodiment of the present application, the doping type of each light emitting layer is any one of or a combination of any two or more of undoped, single-dopant doped, premixing doped and co-doped.

In addition, the OLED display panel of each embodiment of the present application may be a top emission type OLED display panel, for example, the first electrode layer is between the substrate and the second electrode layer, and the first electrodes are total reflection electrodes and the second electrodes are half reflection electrodes. In this way, one part of the lights emitted by the light emitting layers is transmitted to the upper side of the substrate through the second electrodes, and the other part of the lights is transmitted to the upper side of the substrate through the second electrodes after being reflected by the first electrodes.

Or, the OLED display panel of each embodiment of the present application may be a bottom emission type OLED display panel, for example, the first electrode layer is between the substrate and the second electrode layer, and the first electrodes are half reflection electrodes and the second electrodes are total reflection electrodes. In this way, one part of the lights emitted by the light emitting layers is transmitted to the lower side of the substrate through the first electrodes, and the other part of the lights is transmitted to the lower side of the substrate through the first electrodes after being reflected by the second electrodes. In addition, both positive and inverted OLED devices are suitable for the present application as long as a microcavity effect is available.

Figure 9:
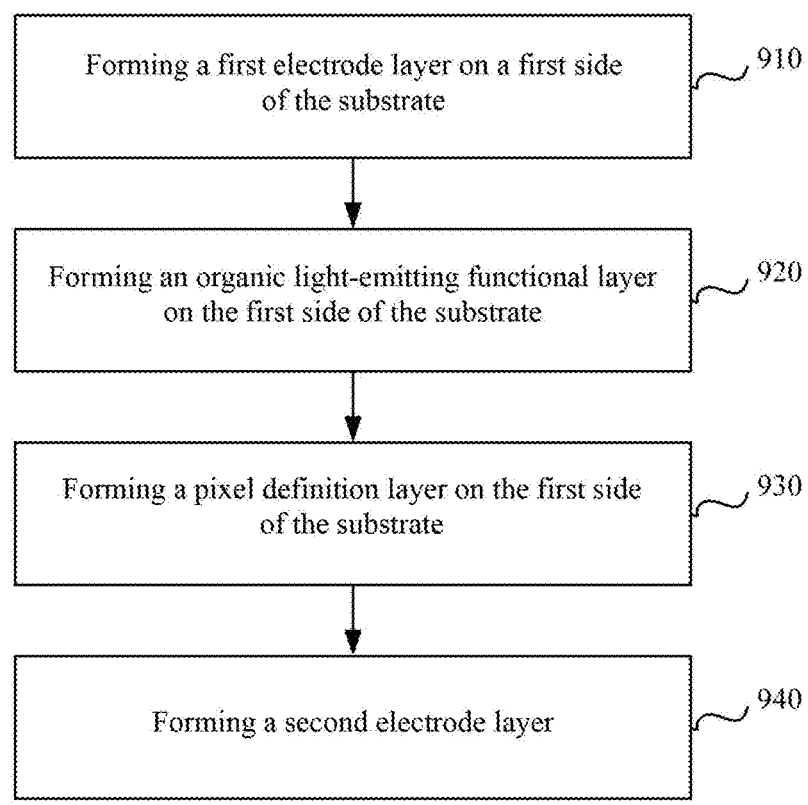
FIG. 9 shows a schematic flow diagram of an embodiment of the manufacturing method of the OLED display panel of the present application.

Refer to FIG. 9, it shows a schematic flow diagram of one embodiment of the manufacturing method of the OLED display panel of the present application.

The manufacturing method of the present embodiment includes:

Step 910, forming a first electrode layer on a first side of the substrate, the first electrode layer comprising first electrodes in an array arrangement;

Step 920, forming an organic light-emitting functional layer on the first side of the substrate;

Step 930, forming a pixel definition layer on the first side of the substrate, the pixel definition layer partitioning the organic light-emitting functional layer to form a pixel array comprising a first color pixel, a second color pixel and a third color pixel in an array arrangement; and Step 940, forming a second electrode layer comprising at least one second electrode, wherein the organic light-emitting functional layer includes a plurality of first optical adjustment units, a plurality of second optical adjustment units and at least one light emitting layer covering a display area of the organic light-emitting display panel; and each first optical adjustment unit is formed in a pixel area of each first color pixel, each second optical adjustment unit is formed in a pixel area of each second color pixel, and the thickness of the first optical adjustment unit is different from that of the second optical adjustment unit.

By using the OLED display panel manufactured by the manufacturing method of the present embodiment, because the organic light-emitting functional layer has a light emitting layer covering the whole display area, the microcavity lengths of the first color pixel and the second color pixel are adjusted respectively through the first optical adjustment unit and the second optical adjustment unit, and in a manufacturing process, only two fine masks (i.e., a fine mask for manufacturing the first optical adjustment unit and a fine mask for manufacturing the second optical adjustment unit) are required, and the number of the fine masks required to manufacture the OLED display panel is reduced, thereby reducing the difficulty of manufacturing the OLED display panel, and improving the manufacturing yield and manufacturing efficiency of the OLED display panel.

It should be noted that the serial numbers of Steps 910-940 are not used for limiting the manufacturing order in the steps. The manufacturing order of the steps may be correspondingly set by those skilled in the art according to needs of actual application scenarios. Therefore, in any order, as long as the above steps 910-940 are included, it is deemed to fall within the scope of protection of the present embodiment.

Figure 10:
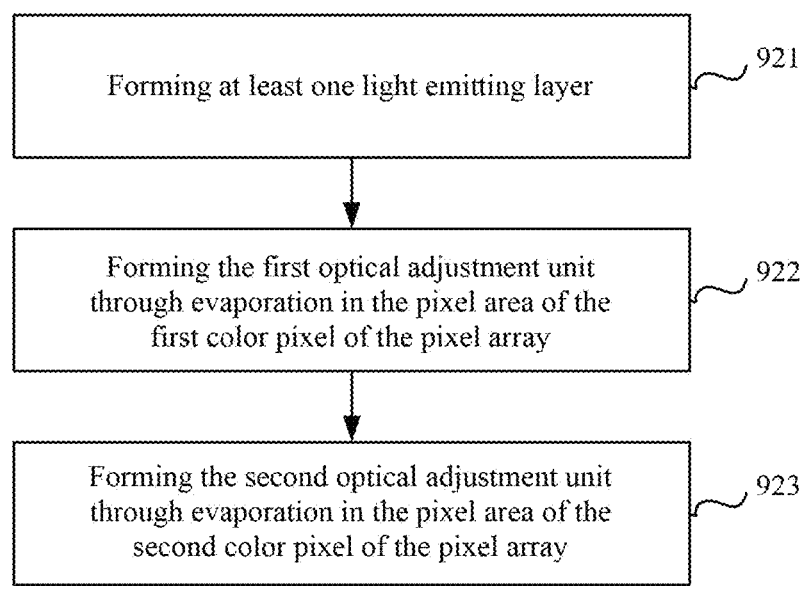
FIG. 10 shows a schematic flow diagram of the forming the organic light-emitting functional layer on the first side of the substrate according to some optional implementations of the present embodiment.

FIG. 10 shows a schematic flow diagram of the forming the organic light-emitting functional layer on the first side of the substrate according to some optional implementations of the present embodiment. As shown in FIG. 10, the forming the organic light-emitting functional layer on the first side of the substrate in Step 920 may further include:

Step 921, forming at least one light emitting layer.

Step 922, forming the first optical adjustment unit through evaporation in the pixel area of the first color pixel of the pixel array. Here, for example, the first optical adjustment unit may be formed through evaporation in the pixel area of the first color pixel of the pixel array by using a first fine mask.

Step 923, forming the second optical adjustment unit through evaporation in the pixel area of the second color pixel of the pixel array. Similarly, here, for example, the second optical adjustment unit may be formed through evaporation in the pixel area of the second color pixel of the pixel array by using a second fine mask.

Because an evaporation process may cooperate with the masks to directly manufacturing a patterned film layer without forming patterns by etching after whole surface coating to save the process, the manufacturing efficiency of the OLED display panel is improved. On the other hand, the evaporation process is usually carried out in a vacuum environment, which can avoid a decrease in yield due to interference of impurities in the manufacturing process.

In some optional implementations of the present embodiment, the wavelength of the color light emitted by the first color pixel is greater than that of the color light emitted by the second color pixel. In these optional implementations, the microcavity wavelength corresponding to the first color pixel is greater than that corresponding to the second color pixel. In these optional implementations, the thickness of the first optical adjustment unit may be greater than that of the second optical adjustment unit, so that the microcavity length corresponding to the first color pixel is greater than that corresponding to the second color pixel. For example, under the premise that the environmental condition of evaporation is unchanged, the evaporation duration for forming the first optical adjustment unit through evaporation is greater than that for forming the second optical adjustment unit through evaporation, thereby enabling the thickness of the first optical adjustment unit to be greater than that of the second optical adjustment unit.

Figure 11:
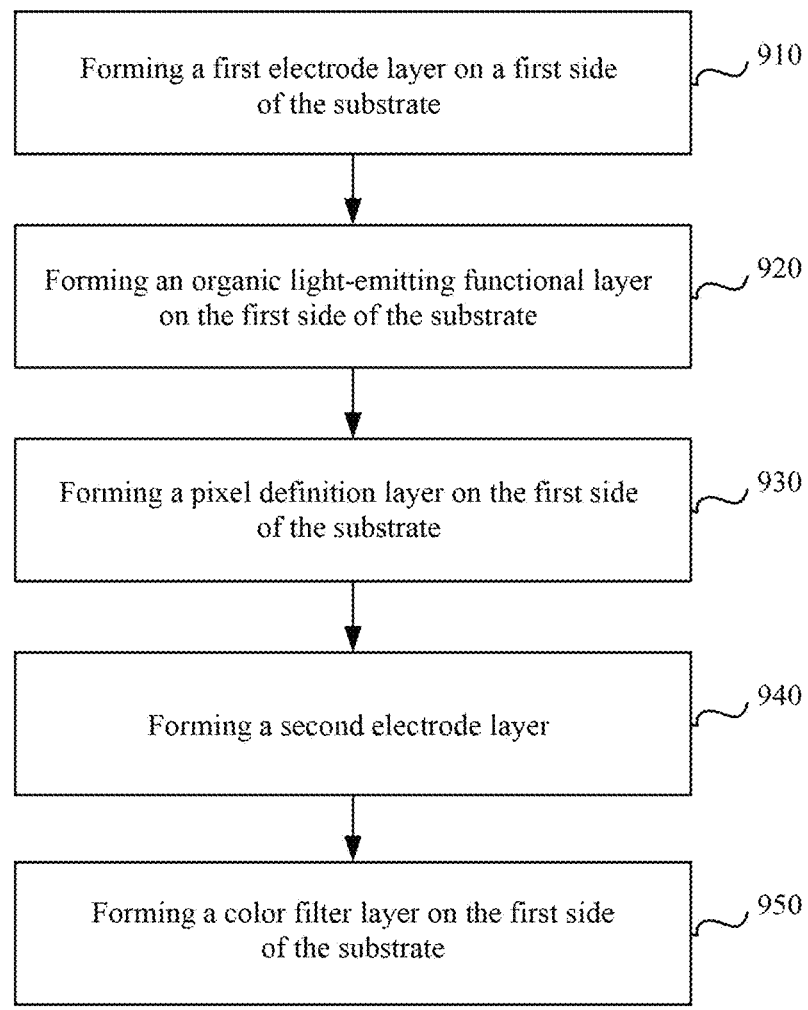
FIG. 11 shows a schematic flow diagram of another embodiment of the manufacturing method of the OLED display panel of the present application.

FIG. 11 shows a schematic flow diagram of another embodiment of the manufacturing method of the OLED display panel of the present application. As shown in FIG. 11, except for Steps 910-940, the manufacturing method of the OLED display panel may further include:

Step 950, forming a color filter layer on the first side of the substrate.

Wherein, the color filter layer includes a first-color color filter unit, a second-color color filter unit and a third-color color filter unit in an array arrangement, an orthographic projection of each first-color color filter unit to the organic light-emitting functional layer is formed in a pixel area of each first color pixel, an orthographic projection of each second-color color filter unit to the organic light-emitting functional layer is formed in a pixel area of each second color pixel, and an orthographic projection of each third-color color filter unit to the organic light-emitting functional layer is formed in a pixel area of each third color pixel.

In this way, since a process of manufacturing the color filter layer is added, light components not expected to be emitted in subpixels with various colors can be further filtered by using the color filter layer to ensure that the range of the wavelengths of the lights respectively emitted by the first color pixel, the second color pixel and the third color pixel is smaller, thereby further enlarging the color gamut of the OLED display panel.

In some optional implementations of the present embodiment, the forming the organic light-emitting functional layer on the first side of the substrate in Step 920 may further include:

forming a first optical adjustment unit and a second optical adjustment unit between the light emitting layer and the first electrode layer, that is to say, the first electrode layer, the first and second optical adjustment units, and the light emitting layer are laminated in an order from the near to the distant from the substrate; or forming the first optical adjustment unit and the second optical adjustment unit between the light emitting layer and the second electrode layer, that is to say, the light emitting layer, the first and second optical adjustment units, and the second electrode layer are laminated in an order from the near to the distant from the substrate.

In some optional implementations, the forming the organic light-emitting functional layer on the first side of the substrate in Step 920 may include:

forming two light emitting layers on the first side of the substrate; and forming the first optical adjustment unit and the second optical adjustment unit between the two light emitting layers.

In this way, because the manufactured OLED display panel includes two light emitting layers, a compound light may be formed by recombining single-color lights emitted by two single-color light emitting layers (for example, a yellow light emitting layer and a blue light emitting layer), and the microcavity effect of different cavity lengths is further used to screen the wavelength of the light expected to be emitted from each pixel. By forming a compound light through recombination of single-color lights emitted by two or more single-color light emitting layers, the optional range of light-emitting materials for manufacturing the light emitting layer may be broadened, thereby further reducing the difficulty of manufacturing the OLED display panel. On the other hand, the light-emitting material of the compound light usually needs mixing of light-emitting materials of a plurality of single-color lights for recombining the compound light, and then the mixed material is formed onto the substrate by, for example, an evaporation process. Thus, the uniformity of the color of the emergent lights of a finally formed compound light emitting layer will depend on the degree of uniformity of mixing. On the contrary, during manufacturing the single-color light emitting layer, the problem of the degree of uniformity of mixing is not considered because the light-emitting material for manufacturing the single-color light emitting layer is single. Thus, when the two light emitting layers manufactured by the manufacturing method of the present embodiment are single-color light emitting layers, the manufacturing process is less difficult, and the yield of the manufactured OLED display panel is correspondingly higher.

In some other optional implementations, the forming the organic light-emitting functional layer on the first side of the substrate in Step 920 may further include: forming a red light emitting layer, a green light emitting layer and a blue light emitting layer on the first side of the substrate; and forming the first optical adjustment unit and the second optical adjustment unit between any adjacent two of the red light emitting layer, the green light emitting layer and the blue light emitting layer.

Thus, since the laminating relation among the first optical adjustment unit, the second optical adjustment unit, and the three (red, green and blue) light emitting layers may be appropriately adjusted, the difficulty of the manufacturing process of the OLED display panel is reduced and the manufacturing yield of the OLED display panel is improved.

In some other optional implementations, the color light emitted by the first color pixel is red light, the color light emitted by the second color pixel is green light, and the color light emitted by the third color pixel is blue light.

In these optional implementations, the forming the organic light-emitting functional layer on the first side of the substrate in Step 920 may further include:

forming a red light emitting layer on the first side of the substrate;

forming the first optical adjustment units on a side of the red light emitting layer away from the substrate;

forming a blue light emitting layer on a side of the red light emitting layer away from the substrate, wherein each first optical adjustment unit is formed between the red light emitting layer and the blue light emitting layer;

forming a green light emitting layer on a side of the blue light emitting layer away from the substrate; and forming the second optical adjustment units on a side of the green light emitting layer away from the substrate.

Thus, based on the above analysis with reference to FIG. 7A to FIG. 7C, the color light expected to be emitted in each pixel of the manufactured OLED display panel may be enhanced to minimize the light intensity of other color lights as much as possible, thereby further enhancing the chromaticity of the OLED display panel in the present embodiment. In addition, the charge generation layer may generate additional holes and electrons, thereby improving the light-emitting efficiency of the manufactured OLED display panel.

In addition, in these optional implementations, Step 920 may further include:

forming a charge generation layer. Wherein, the charge generation layer is formed between the red light emitting layer and the blue light emitting layer, and each first optical adjustment unit is formed between the charge generation layer and the blue light emitting layer. The charge generation layer may generate additional holes and electrons, thereby improving the light-emitting efficiency of the OLED display panel manufactured by using the optional implementations.

Figure 12:
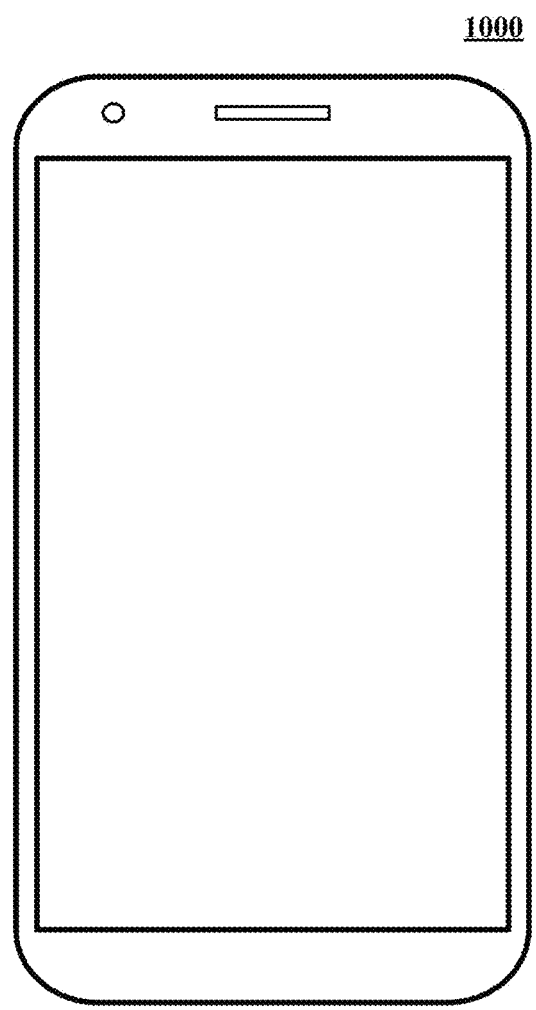
FIG. 12 shows a schematic structure diagram of an embodiment of the OLED display device of the present application.

Refer to FIG. 12, it shows a schematic structure diagram of one embodiment of the OLED display device of the present application.

The display device 1000 may include the OLED display panel described in any one of the above embodiments. It should be understood by those skilled in the art that, in addition to the above OLED display panel, the OLED display device of the present embodiment may further include some other known structures, for example, an integrated circuit chip for providing display signals to the OLED display device. In order not to obscure the focus of the present application, these known structures will no longer be further described.

The OLED display device of the present application may be any device containing the OLED display panel described above, including but not limited to, as shown in FIG. 12, a cellular mobile phone 1000, a tablet computer, a computer display, a display applied to a smart wearable device, a display device applied to means of transportation, such as an automobile, and the like. As long as the OLED display device contains the structure of the OLED display panel disclosed by the present application, it is deemed to fall within the scope of protection of the present application.

According to the OLED display panel, the manufacturing method of the OLED display panel and the OLED display device, disclosed by the present application, by setting the light emitting layer covering the display area and setting the first optical adjustment unit in the pixel area of each first color pixel and the second optical adjustment unit in the pixel area of each second color pixel respectively, the microcavity lengths of different pixel areas are adjusted, and then subpixels with various colors emit different color lights.

Thus, the first optical adjustment unit and the second optical adjustment unit are manufactured respectively by only using fine masks, and the number of fine masks required for manufacturing the OLED display panel is reduced, thereby reducing the difficulty of manufacturing the OLED display panel, and improving the manufacturing yield and manufacturing efficiency.

The above description only provides an explanation of embodiments of the present application and the technical principles used. It should be appreciated by those skilled in the art that the inventive scope of the present application is not limited to the technical solutions formed by the particular combinations of the above-described technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in the present application are examples.

What is claimed is:

1. An organic light-emitting display panel, comprising:
   a substrate;
   a first electrode layer comprising first electrodes in an array arrangement;
   a second electrode layer comprising at least one second electrode;
   an organic light-emitting functional layer formed between the first electrode layer and the second electrode layer; and
   a pixel definition layer partitioning the organic light-emitting functional layer to form a pixel array comprising a first-color pixel, a second-color pixel and a third-color pixel in an array arrangement,
   wherein
   the organic light-emitting functional layer comprises a plurality of first optical adjustment units, a plurality of second optical adjustment units and at least one light emitting layer covering a display area of the organic light-emitting display panel; and
   each first optical adjustment unit is formed in a pixel area of a respective first-color pixel, each second optical adjustment unit is formed in a pixel area of a respective second-color pixel, and a thickness of the first optical adjustment unit is different from that of the second optical adjustment unit,
   the color light emitted by the first-color pixel is red light, the color light emitted by the second-color pixel is green light, and the color light emitted by the third-color pixel is blue light;
   the organic light-emitting functional layer comprises a red light emitting layer, a green light emitting layer and a blue light emitting layer;
   the red light emitting layer, the blue light emitting layer and the green light emitting layer are laminated in an order from the near to the distant from the first electrode layer;
   each first optical adjustment unit is formed between the red light emitting layer and the blue light emitting layer; and
   each second optical adjustment unit is formed on a side of the green light emitting layer away from the substrate.

2. The organic light-emitting display panel according to claim 1, wherein the thickness of the first optical adjustment unit is greater than that of the second optical adjustment unit.

3. The organic light-emitting display panel according to claim 1, further comprising a color filter layer, wherein
the color filter layer comprises a first-color color filter unit, a second-color color filter unit and a third-color color filter unit in an array arrangement; and
an orthographic projection of each first-color color filter unit to the organic light-emitting functional layer is in a pixel area of a respective first-color pixel, an orthographic projection of each second-color color filter unit to the organic light-emitting functional layer is in a pixel area of a respective second-color pixel, and an orthographic projection of each third-color color filter unit to the organic light-emitting functional layer is in a pixel area of a respective third-color pixel.

4. The organic light-emitting display panel according to claim 1, wherein
the first optical adjustment unit and the second optical adjustment unit are formed between the light emitting layer and the second electrode layer.

5. The organic light-emitting display panel according to claim 1, wherein
the first optical adjustment unit and the second optical adjustment unit are formed between the light emitting layer and the first electrode layer.

6. The organic light-emitting display panel according to claim 1, wherein
the organic light-emitting functional layer comprises two light emitting layers; and
the first optical adjustment unit and the second optical adjustment unit are formed between the two light emitting layers.

7. The organic light-emitting display panel according to claim 1, wherein
the organic light-emitting functional layer comprises a red light emitting layer, a green light emitting layer and a blue light emitting layer; and
the first optical adjustment unit and the second optical adjustment unit are formed between any adjacent two of the red light emitting layer, the green light emitting layer and the blue light emitting layer.

8. The organic light-emitting display panel according to claim 1, further comprising a charge generation layer, wherein
the charge generation layer is formed between the red light emitting layer and the blue light emitting layer, and each first optical adjustment unit is formed between the charge generation layer and the blue light emitting layer.

9. The organic light-emitting display panel according to claim 1, wherein
a hole mobility of each first optical adjustment unit is greater than an electron mobility of the each first optical adjustment unit; and
a hole mobility of each second optical adjustment unit is smaller than an electron mobility of the each second optical adjustment unit.

10. The organic light-emitting display panel according to claim 1, wherein
the first electrode layer is between the substrate and the second electrode layer; and
the first electrode is a total reflection electrode, and the second electrode is a half reflection electrode.

11. The organic light-emitting display panel according to claim 1, wherein
the first electrode layer is between the substrate and the second electrode layer; and
the first electrode is a half reflection electrode, and the second electrode is a total reflection electrode.

12. The organic light-emitting display panel according to claim 1, wherein a doping type of each light emitting layer is one or more of:
undoped, single-dopant doped, premixing doped and co-doped.

13. A method of manufacturing an organic light-emitting display panel, comprising:
forming a first electrode layer on a first side of a substrate, the first electrode layer comprising first electrodes in an array arrangement;
forming an organic light-emitting functional layer on the first side of the substrate;
forming a pixel definition layer on the first side of the substrate, the pixel definition layer partitioning the organic light-emitting functional layer to form a pixel array comprising a first-color pixel, a second-color pixel and a third-color pixel in an array arrangement; and
forming a second electrode layer comprising at least one second electrode,
wherein
the organic light-emitting functional layer comprises a plurality of first optical adjustment units, a plurality of second optical adjustment units and at least one light emitting layer covering a display area of the organic light-emitting display panel; and
each first optical adjustment unit is formed in a pixel area of a respective first-color pixel, each second optical adjustment unit is formed in a pixel area of a respective second-color pixel, and a thickness of the first optical adjustment unit is different from that of the second optical adjustment unit,
wherein the forming the organic light-emitting functional layer on the first side of the substrate comprises:
forming at least one light emitting layer;
forming the first optical adjustment unit through evaporation in the pixel area of the first-color pixel of the pixel array; and
forming the second optical adjustment unit through evaporation in the pixel area of the second-color pixel of the pixel array,
wherein the color light emitted by the first-color pixel is red light, the color light emitted by the second-color pixel is green light, and the color light emitted by the third-color pixel is blue light; and
the forming the organic light-emitting functional layer on the first side of the substrate comprises:
forming a red light emitting layer on the first side of the substrate;
forming each first optical adjustment unit on a side of the red light emitting layer away from the substrate;
forming a blue light emitting layer on the side of the red light emitting layer away from the substrate, wherein each first optical adjustment unit is formed between the red light emitting layer and the blue light emitting layer;
forming a green light emitting layer on a side of the blue light emitting layer away from the substrate; and
forming each second optical adjustment unit on a side of the green light emitting layer away from the substrate.

14. The method according to claim 13, wherein
the forming the first optical adjustment unit through evaporation in the pixel area of the first-color pixel of the pixel array comprises:
forming the first optical adjustment unit through evaporation in the pixel area of the first-color pixel of the pixel array by using a first fine mask; and
the forming the second optical adjustment unit through evaporation in the pixel area of the second-color pixel of the pixel array comprises:
forming the second optical adjustment unit through evaporation in the pixel area of the second-color pixel of the pixel array by using a second fine mask.

15. The method according to claim 13, wherein the thickness of the first optical adjustment unit is greater than that of the second optical adjustment unit.

16. The method according to claim 13, further comprising:
forming a color filter layer on the first side of the substrate,
wherein the color filter layer comprises a first-color color filter unit, a second-color color filter unit and a third-color color filter unit in an array arrangement, an orthographic projection of each first-color color filter unit to the organic light-emitting functional layer is in a pixel area of a respective first-color pixel, an orthographic projection of each second-color color filter unit to the organic light-emitting functional layer is in a pixel area of a respective second-color pixel, and an orthographic projection of each third-color color filter unit to the organic light-emitting functional layer is in a pixel area of a respective third-color pixel.

17. The method according to claim 13, wherein the forming the organic light-emitting functional layer on the first side of the substrate comprises:
forming the first optical adjustment unit and the second optical adjustment unit between the light emitting layer and the first electrode layer; or
forming the first optical adjustment unit and the second optical adjustment unit between the light emitting layer and the second electrode layer.

18. The method according to claim 13, wherein the forming the organic light-emitting functional layer on the first side of the substrate comprises:
forming two light emitting layers on the first side of the substrate; and
forming the first optical adjustment unit and the second optical adjustment unit between the two light emitting layers.

19. The method according to claim 13, wherein the forming the organic light-emitting functional layer on the first side of the substrate comprises:
forming a red light emitting layer, a green light emitting layer and a blue light emitting layer on the first side of the substrate; and
forming the first optical adjustment unit and the second optical adjustment unit between any adjacent two of the red light emitting layer, the green light emitting layer and the blue light emitting layer.

20. The method according to claim 13, wherein the forming the organic light-emitting functional layer on the first side of the substrate comprises:
forming a charge generation layer,
wherein the charge generation layer is formed between the red light emitting layer and the blue light emitting layer, and each first optical adjustment unit is formed between the charge generation layer and the blue light emitting layer.

21. An organic light-emitting display device, comprising an organic light-emitting display panel, the organic light-emitting display panel comprising:
a substrate;
a first electrode layer comprising first electrodes in an array arrangement;
a second electrode layer comprising at least one second electrode;
an organic light-emitting functional layer formed between the first electrode layer and the second electrode layer; and
a pixel definition layer partitioning the organic light-emitting functional layer to form a pixel array comprising a first-color pixel, a second-color pixel and a third-color pixel in an array arrangement,
wherein
the organic light-emitting functional layer comprises a plurality of first optical adjustment units, a plurality of second optical adjustment units and at least one light emitting layer covering a display area of the organic light-emitting display panel; and
each first optical adjustment unit is formed in a pixel area of a respective first-color pixel, each second optical adjustment unit is formed in a pixel area of a respective second-color pixel, and a thickness of the first optical adjustment unit is different from that of the second optical adjustment unit,
the color light emitted by the first-color pixel is red light, the color light emitted by the second-color pixel is green light, and the color light emitted by the third-color pixel is blue light;
the organic light-emitting functional layer comprises a red light emitting layer, a green light emitting layer and a blue light emitting layer;
the red light emitting layer, the blue light emitting layer and the green light emitting layer are laminated in an order from the near to the distant from the first electrode layer;
each first optical adjustment unit is formed between the red light emitting layer and the blue light emitting layer; and
each second optical adjustment unit is formed on a side of the green light emitting layer away from the substrate.

* * * * *